United States Patent [19]

Huttemann et al.

[11] Patent Number: 4,981,550
[45] Date of Patent: Jan. 1, 1991

[54] SEMICONDUCTOR DEVICE HAVING TUNGSTEN PLUGS

[75] Inventors: Robert D. Huttemann, Macungie; Nun-Sian Tsai, Allentown, both of Pa.

[73] Assignee: AT&T Bell Laboratories, Murray Hill, N.J.

[21] Appl. No.: 270,389

[22] Filed: Nov. 9, 1988

Related U.S. Application Data

[63] Continuation-in-part of Ser. No. 101,037, Sep. 25, 1987, abandoned.

[51] Int. Cl.$^5$ ................................................. C23F 1/02
[52] U.S. Cl. .................................... 156/643; 156/646; 156/653; 156/656; 156/657; 437/190; 437/192; 437/194; 437/195; 204/192.32; 204/192.35
[58] Field of Search ............... 156/643, 646, 656, 657, 156/653, 665, 664; 437/192, 190, 194, 195, 978; 204/192.32, 182.35

[56] References Cited

U.S. PATENT DOCUMENTS

| | | | |
|---|---|---|---|
| 4,026,742 | 5/1977 | Fujino | 156/643 |
| 4,619,887 | 10/1986 | Hooper et al. | 430/313 |
| 4,630,357 | 12/1986 | Rogers et al. | 437/195 X |
| 4,670,091 | 6/1987 | Thomas et al. | 156/643 |
| 4,851,369 | 7/1989 | Ellwanger et al. | 437/192 X |

*Primary Examiner*—David Simmons
*Assistant Examiner*—Thi Dang
*Attorney, Agent, or Firm*—Wendy W. Koba

[57] ABSTRACT

A metallization scheme useful for integrated circuits uses a buffer layer to ensure that the etch back of a contact metal, such as tungsten, deposited over the buffer layer, can be controlled to form a complete tungsten plug in a via while the tungsten on the dielectric is completely removed. The buffer layer, once exposed, reacts with the plasma etch to form non-volatile compounds which decrease the free surface mobility of the etching species. This active species depletion thus decreases the etch rate of the tungsten within the vias. Continued exposure of unreacted buffer material is ensured by performing a sputter cleaning simultaneously with the plasma etch.

7 Claims, 2 Drawing Sheets

4,981,550

SEMICONDUCTOR DEVICE HAVING TUNGSTEN PLUGS

This application is a continuation-in-part of application Ser. No. 101,037, filed on Sept. 25, 1987, now abandoned.

TECHNICAL FIELD

This invention relates to the field of semiconductor devices having windows, i.e., vias, in dielectrics that are filled with a metal to form a plug having an essentially planar surface with the surface of the dielectric.

BACKGROUND OF THE INVENTION

As semiconductor integrated circuits continue to increase their packing densities by containing more devices with ever smaller dimensions, the problems involved in their fabrication, including electrically contacting individual devices, become more severe.

Electrical contacts are typically made by patterning a dielectric to form windows which expose selected portions of the substrate. The windows are filled with a metal to form the contact to the underlying substrate. Aluminum, the metal most commonly used in integrated circuits, is not easily used to fill small windows because of its poor step coverage. Alternatively, a blanket deposition of another metal, e.g., tungsten, which does have good step coverage may be used. The excess metal present on the dielectric surface is removed by etching to leave, in theory, a planar surface formed by the dielectric and the metal.

However, in practice, problems arise because the thickness of the deposited tungsten layer is frequently not uniform across the wafer. If the etching step clears the dielectric of tungsten on the thicker side, the tungsten in the windows will be severely etched on the thinner side. If the etching just clears the dielectric on the thinner side, the dielectric will not be cleared of tungsten on the thicker side. In neither case will the tungsten and the dielectric form a planar surface. Alternatively, tungsten may be deposited selectively in the windows. However, tungsten is almost invariably deposited, at least to a limited extent, on the dielectric as well. This is, of course, undesirable.

Planar surfaces are desirable because they facilitate subsequent processing. For example, one approach to the problem of electrically contacting the devices simplifies the problem by putting electrical leads on several levels rather than the one level more commonly used at present in integrated circuits. Such an approach simplifies the geometric problems involved in contacting all devices which arise with a single level metal approach. However, the multi-level approach requires the formation of electrical contacts between different metal levels. The problems are similar to those which arise in forming contacts to individual devices. Ultimately, of course, the hope is for circuits with metals on more than two levels as this may allow still more devices per unit area.

SUMMARY OF THE INVENTION

A semiconductor integrated circuit having a metallization is fabricated by depositing a dielectric layer on a substrate and patterning the layer to form vias, i.e., windows, which expose selected portions of the substrate. A buffer layer, which may be deposited either before or after the dielectric layer is patterned, is deposited. The desired contact material is blanket deposited and etched to form a plug with an essentially planar surface. Both the contact material and the material forming the buffer layer are selected so that once the buffer layer is exposed to the etchant, typically a plasma, the etching of the contact material essentially stops at the top of the windows. That is, when a portion of the buffer layer is exposed, the etching species preferentially reacts with the exposed buffer layer and leaves the contact material, e.g., tungsten, in the windows essentially unetched. Continued exposure of the unreacted surface of the buffer layer is ensured by performing a simultaneous sputter cleaning. Thus, all of the contact material deposited on the dielectric may be easily removed while, because of the presence of the buffer layer, no significant etching of the contact metal within the via occurs. A substantially planar surface across the resulting plug and dielectric layer is obtained. In a preferred embodiment, the contact material is tungsten and is deposited by chemical vapor deposition. An exemplary material for the buffer layer is aluminum.

The method can be repeated more than once if two or more metal levels are desired.

For reasons of clarity, the elements depicted are not drawn to scale.

DETAILED DESCRIPTION

Figure 1:
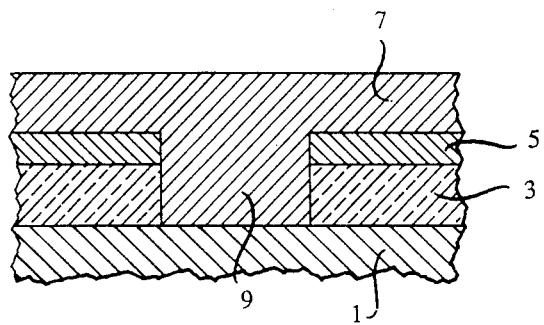
FIG. 1 is a schematic diagram of one structure useful in describing the method of the invention.

The method of this invention will first be explained by reference to FIG. 1 after which several other exemplary structures will be described. Other variations and embodiments will then be apparent to those skilled in the art. Shown in FIG. 1 are substrate 1, dielectric layer 3, buffer layer 5, and contact layer 7. There is a plurality of windows 9 in dielectric layer 3 and buffer layer 5. As can be seen, the windows have been filled with the contact layer material. The windows, i.e., vias, extend through the dielectric layer and expose selected portions of the substrate.

The term substrate is used to mean any material underlying the dielectric. The substrate material may be Si, Al, etc. and it may comprise device regions such as sources, drains, etc. The dielectric layer comprises any typical and well-known dielectric material such as $SiO_2$ or BPTEOS. The buffer layer comprises materials such as Al, Ti, Ta, $Si_3N_4$, TiN, PSG, etc. The materials are conveniently deposited by, for example, sputtering.

Figure 2:
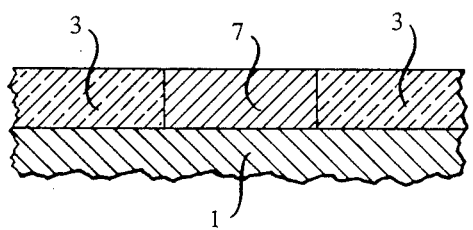
FIG. 2 is a schematic representation of the structure after etching.

To obtain the structure depicted, both the dielectric layer 3 and buffer layer 5 are deposited and then simultaneously patterned to form windows extending through to the substrate. Standard techniques, well known to those skilled in the art, are used. The buffer layer is relatively thin, typically 150–300 nm thick, where it has been determined that the thickness of the buffer layer affects the tungsten etching results. In particular, the amount of tungsten which is removed in the window areas has been found to increase with decreasing thickness of the buffer layer, for example, a 100 nm thick layer results in etching away approximately half of the tungsten deposited in the window, while a 300 nm thick layer effectively leaves a complete fill of tungsten in the window area. Returning to the description of the process, the contact material is then deposited, again using well known techniques, to form layer 7. A plasma etch, is now used to remove the contact layer. The choice of the buffer layer material is dictated by the requirement that there exist an etch which preferentially reacts with the buffer layer material as compared to the dielectric or the contact material. For example, the contact and buffer layer materials are tungsten and aluminum in a preferred embodiment. The contact layer is etched until portions of the buffer layer are exposed. However, once the buffer layer is exposed to the etching plasma, the etching rate of the contact material in the windows is reduced significantly. For example, if the plasma uses $SiF_4$, then the etching species, $F^-$, favors reactions with the exposed buffer layer, Al, and leaves the contact material, W, unattacked. In particular, the etching species combines with the buffer material to form nonvolatile fluorides. This fluorination process decreases the amount of free fluorine which is available and, hence, effectively decreases the the window etch rate by active species depletion. Continued exposure of unfluorinated buffer material is required to prevent the plasma from again etching the contact material in the window areas. This exposure is ensured in accordance with the present invention by simultaneously sputter cleaning the buffer layer with an inert ion source (e.g., argon). Therefore, significant etching of the material in the window does not occur. Finally, any remaining buffer layer material is stripped using either a wet or a dry chemical etch. Etches using HCl are suitable. Any etch residue remaining on the buffer layer surface is also removed by this chemical etch step. The structure is depicted in FIG. 2. An essentially planar surface is formed by the dielectric and the contact material due to the thinness of the buffer layer.

Alternatively, the dielectric layer may be patterned, and then both the buffer and contact materials deposited. The thinness of the aluminum deposition on the walls of the windows is an asset in this approach.

The materials choice described can result in a fill factor for the plug which is greater than 80 percent.

It will be readily appreciated that the process described above with respect to FIGS. 1 and 2 can be readily extended to complicated multilevel metallizations including headless metal patterns, as the described process may be repeated.

Figure 3:
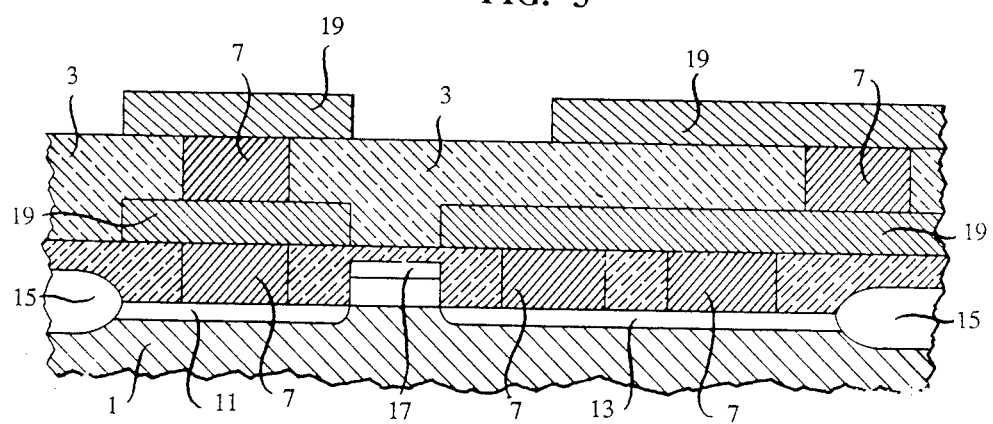
FIG. 3 is a schematic representation of another structure according to this invention.

An exemplary structure is depicted in FIG. 3. In addition to the elements previously depicted and described, there are source and drain regions, 11 and 13, respectively, field oxides 15, and a gate electrode 17. Two levels of metallization 19 are depicted.

Figure 4:
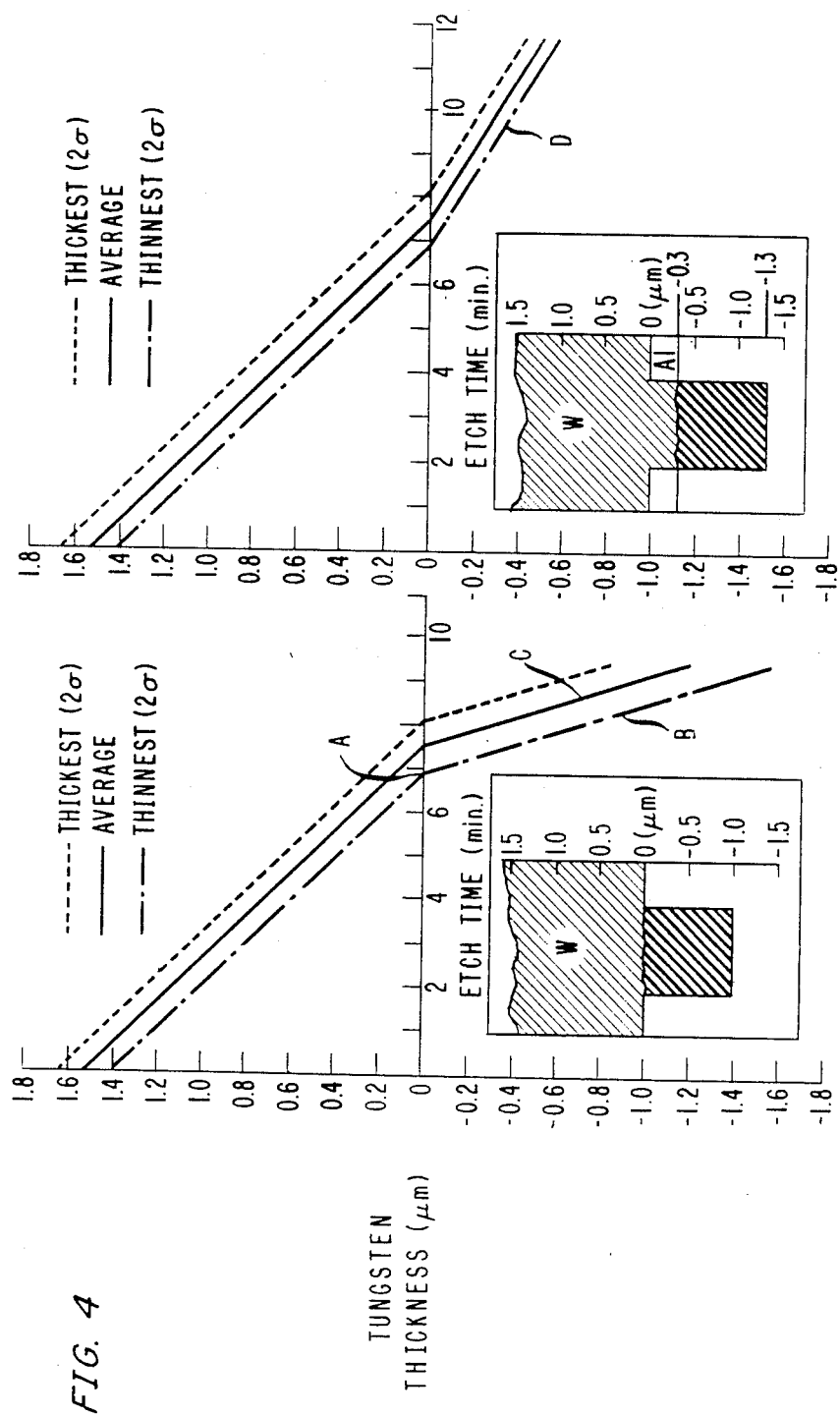
FIG. 4 is a graphic omparison of the contact material etch rates for a conventional structure and a structure including the buffer layer as disclosed by this invention.

FIG. 4 summarizes, in the form of a graph, the improvement in window planarization when a buffer layer is utilized in accordance with the teachings of the present invention. The graph on the left-hand side of FIG. 4 depicts an exemplary etching of a tungsten contact material film on a structure which does not include a layer of buffer material. As indicated, the thickness of the CVD tungsten film varies from a minimum of approximately 1.4 $\mu$m to a maximum of 1.6 $\mu$m across the surface of the wafer, with an average thickness of 1.5 $\mu$m. After approximately seven minutes of plasma etching, the thinner portions of the tungsten film will be completely removed, as indicated by the letter A of the dashed line etch rate curve in FIG. 4. The plasma will then etch the exposed tungsten in the window areas, which as discussed above will etch more rapidly due to micro-loading effects. This resulting significant acceleration of the etch rate within the exposed windows in this area is indicated by portion B of the dashed line etch rate curve.

In order for the thickest portions of the tungsten film to be removed, the plasma etch process must continue for at least another two minutes, as indicted by the dotted line etch rate curve associated with the maximum tungsten thickness. During this two minute period, the accelerated etch of the tungsten within the exposed window areas continues at its accelerated pace as indicated by the dashed line B, as well as the solid line C associated with the wafer region having an average thickness of deposited tungsten. In particular, the tungsten in the windows in the region with the thinnest initial tungsten film deposit will be etched to approximately 700 nm below the top of the window, with the windows associated with the average tungsten thickness etched to approximately 350 nm. Thus, the tungsten contacts formed in a number of these window areas will be essentially removed, with a number of remaining windows only half-filled. This non-uniformity in tungsten filling is the problem solved by adding the buffer layer in accordance with the practice of the present invention.

The three etch rate plots on the right-hand side of FIG. 4 are associated with an exemplary structure formed in accordance with the present invention, including a 300 nm aluminum buffer layer and a tungsten contact layer. As with the plots described above, the dashed line is associated with the etch rate for the thinnest tungsten film, the solid line with the average thickness of deposited tungsten, and the dotted line associated with the thickest portion of the tungsten film deposit. As discussed above, the variation in thickness is approximately 200 nm, from a minimum of 1.4 $\mu$m to a maximum of 1.6 $\mu$m.

The initial portion of the plasma etching of the structure including the buffer layer is identical to that described above. That is, after approximately seven minutes of etching, the thinnest portions of the tungsten film will be completely removed. It is to be noted that the tungsten/aluminum interface is defined as the 0 $\mu$m level, water surface, with the substrate surface being a distance D below this 0 $\mu$m level, D being defined as the thickness of the buffer layer (300 nm in this particular case).

Returning to the graph, once the underlying aluminum buffer layer is exposed under the thinnest portion of the tungsten film, it is seen that the etch rate of the tungsten in the exposed window areas decreases significantly, as indicated by portion D of the dashed line etch rate curve. This decrease, as discussed above, is attributed to the formation of non-volatile $AlF_3$ on the surface of the aluminum buffer layer. The formation of this compound decreases the amount of free fluorine which is available and, hence, the tungsten etch rate. As stated above, a sputter cleaning with an inert material, such as argon, must be performed simultaneously with the plasma etch to replenish the supply of fresh aluminum available for reaction with the $F^-$ etching species.

As seen by reference to FIG. 4, if the plasma etching is continued for another four minutes (ten minutes total etching) to remove all of the tungsten from the thickest areas, at most 80 nm of tungsten will be etched from the exposed window areas. This represents approximately an order of magnitude improvement when compared with the conventional procedure where approximately 700 nm of tungsten was etched from the window areas after only an eight minute etch.

As mentioned above, materials other than aluminum may be used as the buffer layer. For example, titanium is another common choice. In particular, titanium provides an enhanced fluorine getter medium, forming both volatile and non-volatile titanium fluorides. As with the aluminum buffer layer, argon sputtering of the non-volatile component is required to replenish the supply of unreacted titanium. An advantage of using titanium instead of aluminum is that any titanium material remaining at the completion of the plasma etch may be removed in-situ, as compared with the wet chemical etch required for the aluminum buffer layer.

What is claimed is:

1. A method of making a semiconductor integrated circuit having a metalization comprising the steps of:
    depositing a dielectric layer on a substrate;
    patterning said dielectric layer to form windows in selected areas above said substrate;
    depositing a buffer layer over said dielectric layer;
    blanket depositing a contact layer so as to completely cover said buffer layer and at least fill said windows formed by the patterning, said contact layer being of a different material than said buffer layer;
    plasma-etching said contact layer and underlying buffer layer with a fluorine-based etch which preferentially forms non-volatile fluoride compounds with said buffer layer as compared to reacting with said contact layer; and
    simultaneously with the preceding step, sputtering said buffer layer to remove fluoride compounds and expose unreacted buffer material, the simultaneous plasma-etching and sputtering operations continuing until essentially all of the contact layer outside of the windows is removed.

2. A method as recited in claim 1 in which said contact layer comprises tungsten.

3. A method as recited in claim 2 in which said buffer layer comprises at least one material selected from the group consisting of aluminum, titanium, tantalum, silicon nitride, titanium nitride and PSG.

4. A method as recited in claim 3 in which said at least one material comprises aluminum.

5. A method as recited in claim 1 in which said buffer layer is deposited before said patterning step is performed such that both the dielectric layer and buffer layer are patterned.

6. A method as recited in claim 3 in which said at least one material comprises titanium.

7. A method as recited in claim 1 in which the buffer material is deposited to a thickness in the range of approximately 150–300 nm.

* * * * *